(12) United States Patent  (10) Patent No.: US 11,774,992 B2
Takano et al.  (45) Date of Patent: Oct. 3, 2023

(54) POWER SUPPLY DEVICE AND SEMICONDUCTOR DEVICE FOR POWER SUPPLY CONTROL

(71) Applicants: Yoichi Takano, Hadano (JP); Shinichiro Maki, Hiratsuka (JP); Katsuhiro Yokoyama, Atsugi (JP)

(72) Inventors: Yoichi Takano, Hadano (JP); Shinichiro Maki, Hiratsuka (JP); Katsuhiro Yokoyama, Atsugi (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 220 days.

(21) Appl. No.: 17/329,347

(22) Filed: May 25, 2021

(65) Prior Publication Data

US 2021/0373586 A1  Dec. 2, 2021

(30) Foreign Application Priority Data

May 26, 2020 (JP) .................. 2020-091292

(51) Int. Cl.
*G05F 1/56* (2006.01)
*H02M 3/158* (2006.01)
(Continued)

(52) U.S. Cl.
CPC ........... *G05F 1/56* (2013.01); *G05D 23/1919* (2013.01); *G06F 1/206* (2013.01); *G06F 1/3206* (2013.01);
(Continued)

(58) Field of Classification Search
CPC ... G05F 1/10; G05F 1/267; G05F 1/46; G05F 1/561; G05F 1/567; G05F 1/569; G05F 1/571; G05F 1/573; G05F 1/5735; G05F 1/461; G05F 1/462; G05F 1/463; G05F 1/465; G05F 1/466; G05F 1/467;
(Continued)

(56) References Cited

U.S. PATENT DOCUMENTS 6,709,111 B2  3/2004  Hirao et al.
8,547,075 B1*  10/2013  Mosinskis ............... G05F 1/56
                                                         323/224

(Continued)

FOREIGN PATENT DOCUMENTS

JP  2002364583 A  12/2002
JP  2019185732 A  10/2019

OTHER PUBLICATIONS

U.S. Appl. No. 17/117,705, First Named Inventor: Yoichi Takano; Title: "Semiconductor Integrated Circuit for Regulator, and Fan Motor System"; filed Dec. 10, 2020.

*Primary Examiner* — Bryan R Perez
(74) *Attorney, Agent, or Firm* — Holtz, Holtz & Volek PC

(57) ABSTRACT

Disclosed is a power supply device including a first direct-current power source that generates a direct-current voltage to be supplied to a device that is a load, and a second direct-current power source that generates a direct-current voltage to be supplied to a sensor that detects a physical quantity. The first direct-current power source is an output variable type power source that generates a direct-current voltage that changes according to a signal from the sensor, and the second direct-current power source is an output fixed type power source that generates a constant direct-current voltage.

8 Claims, 3 Drawing Sheets

(51) Int. Cl.
*G05D 23/19* (2006.01)
*G06F 1/3206* (2019.01)
*H05K 7/20* (2006.01)
*G06F 1/20* (2006.01)

(52) U.S. Cl.
CPC ........ *H02M 3/158* (2013.01); *H05K 7/20209* (2013.01)

(58) Field of Classification Search
CPC . G05F 1/56; G05F 1/562; G05F 1/563; G05F 1/565; G05F 1/575; G05F 1/577; G05F 1/585; G05F 1/59; G05F 1/595; G05F 1/607; G05F 1/61; G05F 1/613; G05F 1/614; G05F 1/618; G05F 1/62; G05F 1/66; G05F 1/08; G05F 1/153; G05F 1/16; G05F 1/26; G05F 1/34; G05F 3/02; G05F 3/30; G05F 3/22; G05F 3/222; G05F 3/242; G05F 3/225; G05F 3/245; G05F 3/20; G05F 3/00; G05F 3/08; G05F 3/10; G05F 3/16; G05F 3/18; G05F 3/185; G05F 3/227; G05F 3/247; G05F 3/26; G05F 3/265; G05F 3/24; G05F 3/262

See application file for complete search history.

(56) References Cited

U.S. PATENT DOCUMENTS

| | | |
|---|---|---|
| 10,831,222 B2 | 11/2020 | Maki et al. |
| 2020/0371538 A1 | 11/2020 | Maki et al. |
| 2021/0018946 A1 | 1/2021 | Maki et al. |
| 2021/0018947 A1 | 1/2021 | Maki et al. |
| 2021/0034088 A1 | 2/2021 | Takano et al. |

* cited by examiner

POWER SUPPLY DEVICE AND SEMICONDUCTOR DEVICE FOR POWER SUPPLY CONTROL

CROSS-REFERENCE TO RELATED APPLICATION

This application is based upon and claims the benefit of priority from the prior Japanese Patent Application No. 2020-091292, filed on May 26, 2020, the entire contents of which are incorporated herein by reference.

BACKGROUND

Technical Field

The present invention relates to a power supply device that can supply direct-current voltages of two systems, and particularly relates to a technique that is effectively used in a power supply device that can generate a variable direct-current voltage supplied to a load and a constant direct-current voltage supplied to a sensor.

Background Art

There have been conventionally electronic equipment including an air blowing device (fan) for cooling. The electronic equipment is provided with a temperature sensor such as a thermistor in a housing of the electronic equipment, and changes an air blowing amount by inputting a signal from the temperature sensor to a control device such as a microcomputer, and causing the control device to linearly change the voltage to drive a motor that rotates the fan according to the detected temperature in the housing of the electronic equipment. To be specific, there is electronic equipment that is configured to increase the air blowing amount by raising the rotation speed of the cooling fan as the temperature rises and to decrease the air blowing amount by lowering the rotation speed of the cooling fan as the temperature lowers (for example, see JP 2002-364583 A).

There is also electronic equipment that is configured to change the rotation speed of the cooling fan according to the detected temperature by the microcomputer controlling the output voltage of the power supply device that generates a power supply voltage to be supplied to the air blowing device and changing the power supply voltage according to the signal from the temperature sensor (for example, see JP 2019-185732 A).

However, the control device of the cooling fan described in JP 2002-364583 A controls the rotation speed of the cooling fan by the microcomputer, and the signal from the temperature sensor needs to be converted into a digital signal to be input to the microcomputer. Thus, an expensive microcomputer that includes an AD converting circuit is required. There is also a problem that a DA converting circuit is also required to generate a signal that controls the fan motor on the basis of the processing results of calculating the rotation speed of the cooling fan according to the temperature.

Furthermore, when a microcomputer is used, the fan and the microcomputer are generally provided at separate positions in many cases. Thus, there is also a problem that a relatively long wiring is necessary to connect the fan and the temperature sensor to the microcomputer and furthermore it is necessary to develop the program of the microcomputer, which increases the cost.

It is necessary to supply the power supply voltage to the temperature sensor. A common power supply voltage may be used as the power supply voltage supplied to the temperature sensor and as the power supply voltage supplied to the air blowing device. However, in this case, there is a problem that changing the power supply voltage supplied to the air blowing device by the microcomputer changes the power supply voltage of the temperature sensor and changes the temperature-voltage characteristic of the temperature sensor, and it is not possible to perform desired control of the rotation speed according to the temperature, as in the invention described in JP 2019-185732 A.

SUMMARY

The present invention has been made in view of the above-described problems, and an object of the present invention is to provide a power supply device and a semiconductor device for power supply control forming the power supply device that can control the rotation speed of a fan according to the surrounding temperature without using a microcomputer, that is, without largely increasing the cost.

Another object of the present invention is to provide a power supply device and a semiconductor device for power supply control forming the power supply device that can control the rotation speed of a fan according to the surrounding temperature without influencing the temperature-voltage characteristic of the temperature sensor.

In order to achieve at least one of the above objects, according to an aspect of the present invention, there is provided a power supply device including: a first direct-current power source that generates a direct-current voltage to be supplied to a device that is a load; and a second direct-current power source that generates a direct-current voltage to be supplied to a sensor that detects a physical quantity, wherein the first direct-current power source is an output variable type power source that generates a direct-current voltage that changes according to a signal from the sensor, and the second direct-current power source is an output fixed type power source that generates a constant direct-current voltage.

According to another aspect of the present invention, there is provided a semiconductor device for power supply control including: a voltage input terminal to which a direct-current voltage is input; a first output terminal and a second output terminal; a first voltage control transistor that is connected between the voltage input terminal and the first output terminal; a first control circuit that controls the first voltage control transistor according to a feedback voltage of an output of the first output terminal; a second voltage control transistor that is connected between the voltage input terminal and the second output terminal; a second control circuit that controls the second voltage control transistor according to a feedback voltage of an output of the second output terminal; and an external terminal to which an output control signal is input, the output control signal being supplied from outside to control an output voltage of the first output terminal, wherein the first control circuit includes: a first error amplifier that outputs a voltage according to a potential difference between a reference voltage and a divided voltage by a first voltage dividing circuit that divides the output voltage of the first output terminal; and an output voltage changing circuit that changes the output voltage of the first output terminal to a voltage according to the output control signal by displacing the divided voltage by the first voltage dividing circuit or the reference voltage to be input to the first error amplifier according to a voltage that is input to the external terminal, and the second control circuit includes a second error amplifier that outputs a voltage according to a potential difference between a predetermined reference voltage and a divided voltage by a second voltage dividing circuit that divides an output voltage of the second output terminal.

BRIEF DESCRIPTION OF THE DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, a preferred embodiment of the present invention will be described with reference to the drawings.

Figure 1:
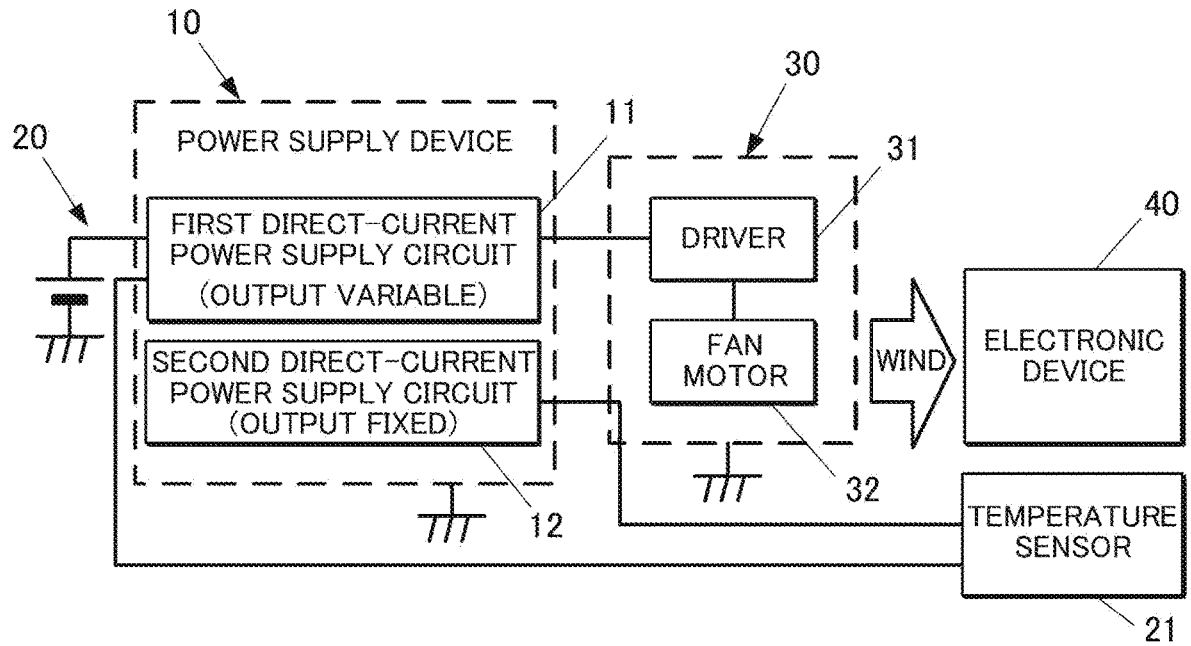
FIG. 1 is a functional block diagram showing an embodiment of a power supply device according to the present invention and a configuration example of a system using the power supply device.

FIG. 1 is a functional block diagram showing an embodiment of a power supply device according to the present invention and a configuration example of a system using the power supply device.

As shown in FIG. 1, the power supply device 10 in the present embodiment includes: a first direct-current power supply circuit 11 that receives a direct-current voltage from a direct-current power supply 20 such as a battery and generates and outputs a power supply voltage of a driver 31 of an air blowing device 30 as a load; and a second direct-current power supply circuit 12 that generates and outputs a power supply voltage of a temperature sensor (temperature detector) 21 such as a thermistor. The first direct-current power supply circuit 11 generates a direct-current power supply voltage that changes according to the signal from the temperature sensor 21, and the second direct-current power supply circuit 12 generates and outputs a constant direct-current power supply voltage.

The air blowing device 30 is configured by including a driver 31, a fan motor 32 that is current-driven by the driver 31 and rotates, and a fan (not shown in the drawings) that is rotated by the fan motor 32. The wind generated by rotation of the fan is supplied to an electronic device 40 that is the target of cooling and the electronic device 40 is cooled. The device that is the target of cooling is not limited to the electronic device 40. The device may be any device or any electronic equipment.

The temperature sensor 21 is arranged near the electronic device 40, for example, inside the housing of the electronic device 40. The temperature sensor 21 detects the temperature in the housing, the detection signal is input to the first direct-current power supply circuit 11, and the first direct-current power supply circuit 11 variably controls the output voltage according to the detection signal of the temperature sensor 21.

Figure 2:
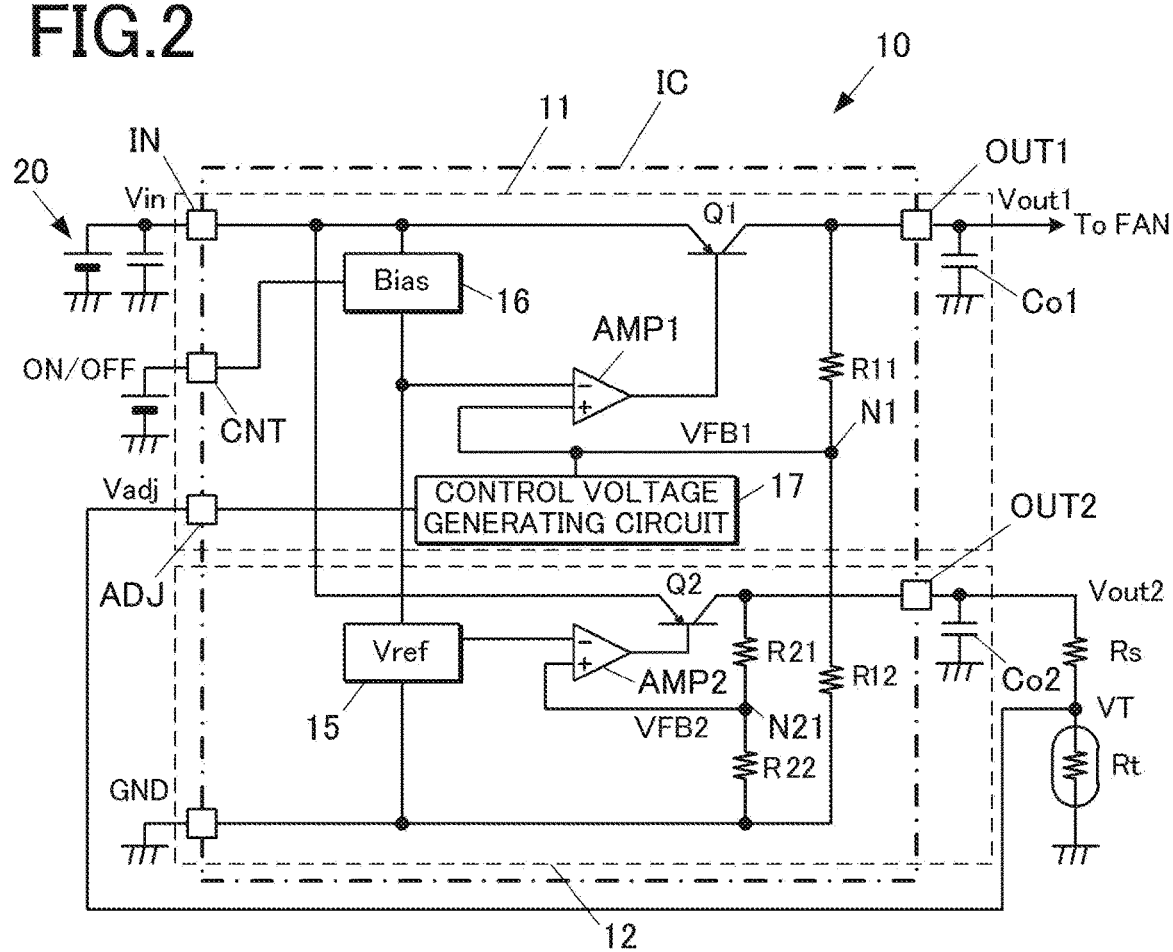
FIG. 2 is a circuit configuration view showing a configuration example of the power supply device (regulator) in the embodiment.

FIG. 2 shows a circuit configuration view of a specific example of the power supply device 10. In FIG. 2, the portion surrounded by the one-dot chain line is formed as a semiconductor integrated circuit (power supply control IC) on a semiconductor chip such as a monocrystalline silicon. There are provided, to the power supply control IC, a voltage input terminal IN to which a direct-current input voltage Vin is applied; an output voltage variable regulator as the first direct-current power supply circuit 11 that outputs a direct-current voltage to a load such as the air blowing device 30 shown in FIG. 1; a constant voltage direct-current regulator as the second direct-current power supply circuit 12 that outputs a stable direct-current voltage to a thermistor Rt as a temperature sensor; and output terminals OUT1 and OUT2 corresponding to the respective direct-current power sources. The capacitors Co1 and Co2 are connected to the respective output terminals OUT1 and OUT2, to function as direct-current power sources that output stable direct-current power voltages.

As shown in FIG. 2, in the power supply device 10 in the present embodiment, the voltage control transistors Q1 and Q2 formed of PNP bipolar transistors are connected between the voltage input terminal IN and the output terminals OUT1 and OUT2, respectively. The error amplifiers (error amplifying circuits) AMP1 and AMP2 that respectively control base terminals of the voltage control transistors Q1 and Q2 are provided inside the IC.

Furthermore, resistors R11 and R12 connected in series, and resistors R21 and R22 connected in series, are connected between the respective output terminals OUT1 and OUT2 and a ground line (ground point) to which a ground potential GND is applied. The resistors R11 and R12 and the resistors R21 and R22 respectively divide the output voltages Vout1 and Vout2.

The voltage at the connection node N1 of the resistors R11 and R12 for dividing the output voltage is input as a feedback voltage VFB1 to a non-inverting input terminal of the above error amplifier AMP1. The voltage of the connection node N2 of the resistors R21 and R22 for voltage division is input as a feedback voltage VFB2 to a non-inverting input terminal of the above error amplifier AMP2.

A predetermined reference voltage Vref is input to inverting input terminals of the above error amplifiers AMP1 and AMP2, and the error amplifiers AMP1 and AMP2 generate voltages according to potential differences between the output feedback voltages VFB1 and VFB2 and the reference voltage Vref and supplies the generated voltages to respective gate terminals of the voltage control transistors Q1 and Q2 to control the transistors Q1 and Q2, to control the output voltages Vout1 and Vout2 to be respective desired electric potentials. That is, each of the first direct-current power supply circuit 11 and the second direct-current power supply circuit 12 is configured to form a low drop out linear regulator (LDO) of a series regulator type.

The regulator IC in the example includes: a reference voltage source 15 that generates the reference voltage Vref on the basis of the input voltage Vin; a bias circuit 16 that generates operation current of the reference voltage source 15 and the error amplifiers AMP1 and AMP2; and an on/off control terminal CNT as an external terminal to input a signal ON/OFF for controlling the on/off of the bias circuit 16. When the on/off control signal ON/OFF of a low level (0V) is input to the on/off control terminal CNT, the bias circuit 16 stops supplying of the operation current to the reference voltage source 15 and the error amplifiers AMP1 and AMP2, and stops the operation of these circuits.

The regulator IC in the present embodiment further includes: an output control terminal ADJ as an external terminal to input a control signal Vadj; and a control voltage generating circuit 17 that corrects the feedback voltage VFB1 to the error amplifier AMP1 according to the control signal Vadj. The output voltage Vout1 to be output from the output terminal OUT1 is changed by correcting the feedback voltage VFB1 input to the error amplifier AMP1.

The resistor Rs and the thermistor Rt are connected in series between the output terminal OUT1 and a ground point, and an electric potential (hereinafter, referred to as a thermistor voltage) VT at a connection node between the resistor Rs and the thermistor Rt is input as a control signal Vadj to the output control terminal ADJ of the regulator IC. Thus, the output voltage Vout1 is changed according to the characteristic of the thermistor Rt. The resistor Rs is an adjustment resistor for correcting the non-linear temperature characteristic of the thermistor Rt and causing the change of the thermistor voltage VT to be close to a straight line.

Figure 3A:
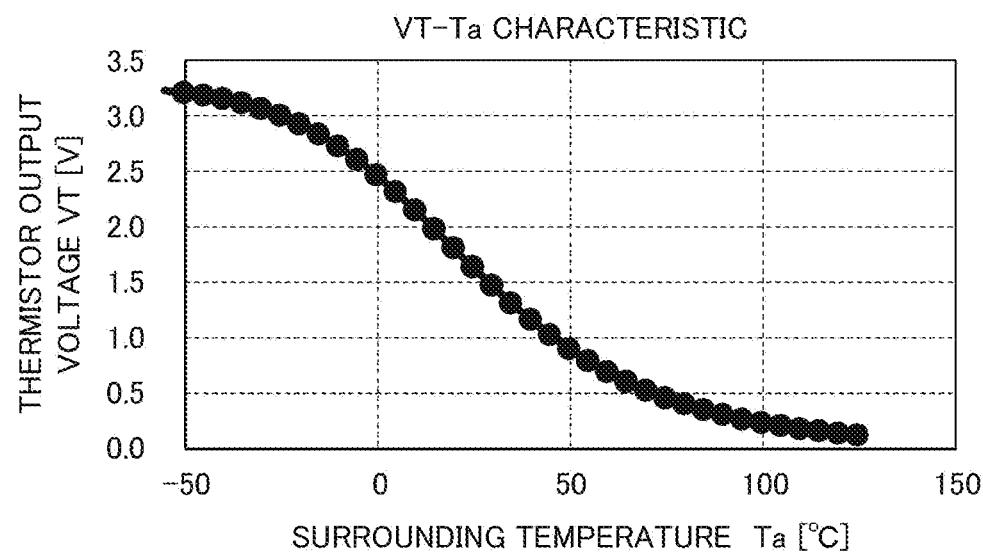
FIG. 3A is a characteristic view showing the temperature characteristic of a thermistor that is used for the power supply device in the embodiment.
Figure 3B:
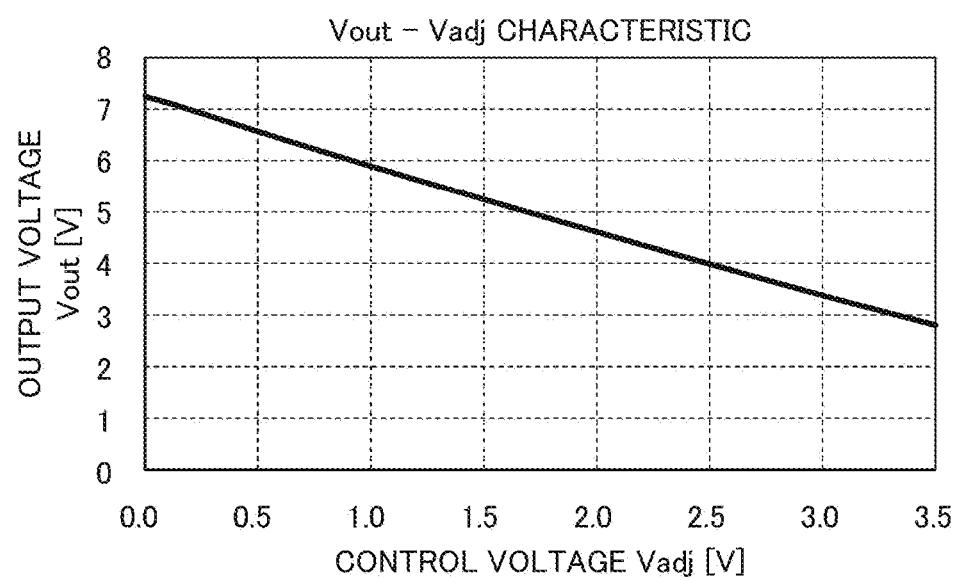
FIG. 3B is a characteristic view showing the relationship between a control voltage (thermistor voltage) and an output voltage in the regulator forming the power supply device in the embodiment.

FIG. 3A shows the relationship between the thermistor voltage VT and the surrounding temperature Ta in a case of using an NTC (Negative Temperature Coefficient) type thermistor. FIG. 3B shows the relationship between the control signal Vadj input to the output control terminal ADJ, that is, the NTC thermistor voltage VT and the output voltage Vout1 of the output variable regulator REG1.

FIG. 3A shows that the thermistor voltage VT is lower as the surrounding temperature Ta is higher, FIG. 3B shows that the output voltage Vout1 is higher as the control signal Vadj, that is, the thermistor voltage VT is lower. When the output voltage Vout1 of such a property is supplied to the air blowing device 30, as the surrounding temperature Ta is higher, the output voltage Vout1 is higher, and the rotation speed of the fan is faster, thus making the cooling ability higher.

Accordingly, according to the power supply device of the present embodiment, it is possible to control the rotation speed of the fan without control by the microcomputer. Since the output voltage Vout2 of the second direct-current power supply circuit 12 applied to the temperature detector formed of the resistor Rs and the thermistor Rt is constant irrespective of the temperature, it is possible to prevent the change in temperature characteristic of the thermistor voltage VT caused by the change of the power supply voltage.

As the thermistor Rt, a PTC (Positive Temperature Coefficient) type thermistor having an opposite temperature characteristic to that of FIG. 3A may be used. In such a case, the resistor Rs and the thermistor Rt are connected in the opposite relationship to the relationship in FIG. 2.

Figure 4:
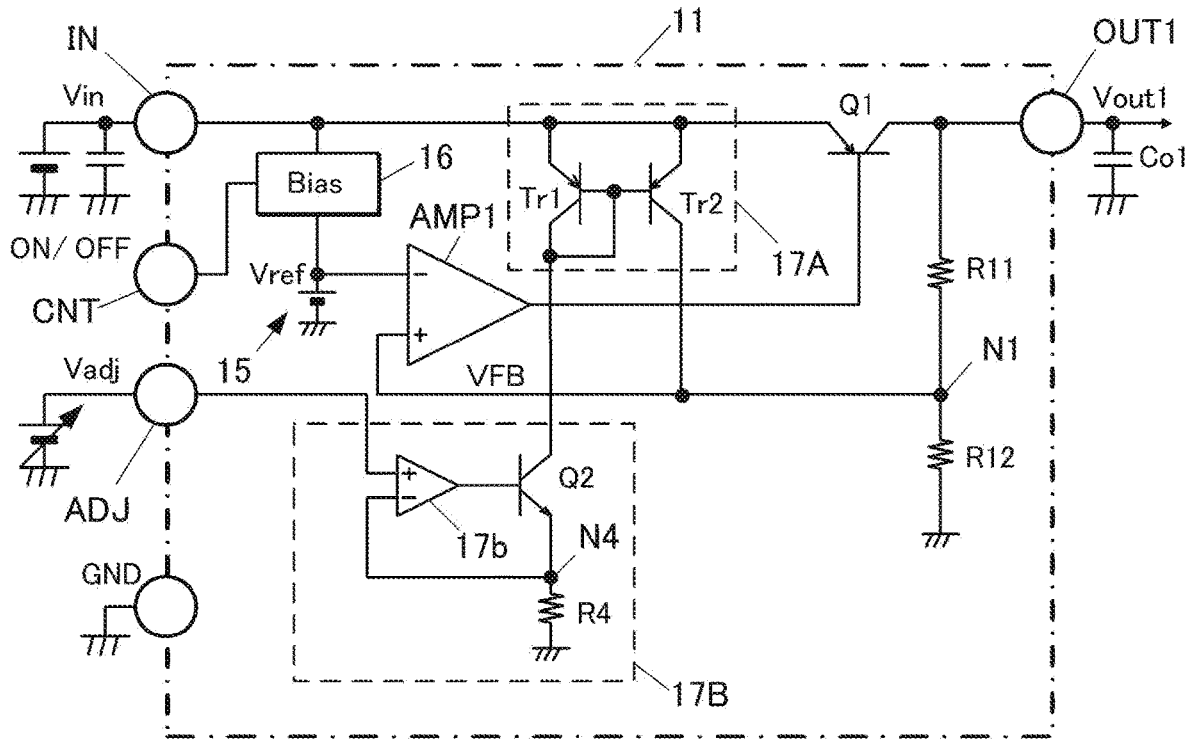
FIG. 4 is a circuit view showing a specific example of a control voltage generating circuit in a case of using an NTC thermistor.
Figure 5:
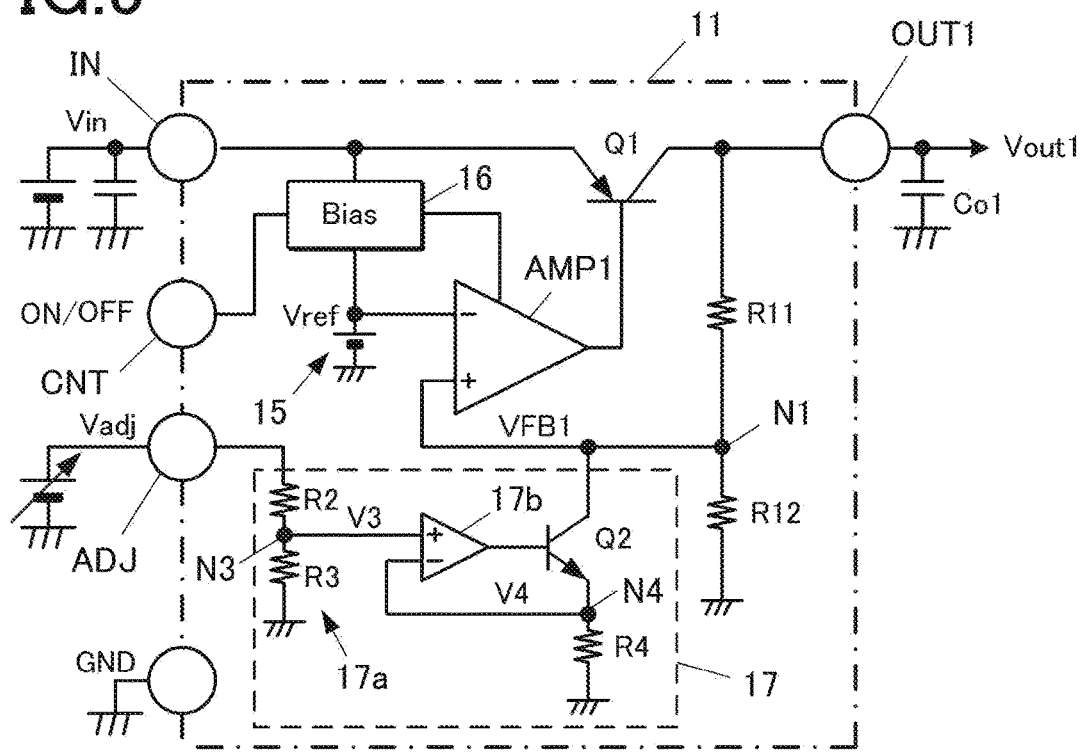
FIG. 5 is a circuit view showing a specific example of a control voltage generating circuit in a case of using a PTC thermistor

The specific example of the above control voltage generating circuit 17 will be described by using FIGS. 4 and 5. FIGS. 4 and 5 show only the output variable regulator portion forming the first direct-current power supply circuit 11 in the regulator IC shown in FIG. 2. The circuits other than the control voltage generating circuit 17 have same configurations as those of FIG. 2. FIG. 4 shows a circuit example of the control voltage generating circuit in a case where the NTC type is used as the thermistor. FIG. 5 shows a circuit example of the control voltage generating circuit in a case where the PTC type is used as the thermistor.

The control voltage generating circuit shown in FIG. 4 includes: a current mirror circuit 17A that is formed of transistors Tr1 and Tr2 having the base terminals thereof connected to each other; and an output voltage changing circuit 17B that has an error amplifier 17b having a non-inverting input terminal to apply the output control signal Vadj that is input to the external terminal ADJ. The transistors Tr1 and Tr2 forming the current mirror circuit 17A have emitter terminals connected to the voltage input terminal IN, and a collector terminal of the transistor Tr2 is connected to the connection node N1 of the resistors R1*l* and R12 for dividing the output voltage. The output voltage changing circuit 17B includes a transistor Q2 and a resistor R4 that are connected in series to the transistor Tr1 of the current mirror circuit 17A.

The output terminal of the above error amplifier 17b is connected to the base terminal of the transistor Q2, and the voltage V4 of the connection node N4 of the transistor Q2 and the resistor R4 is input to the inverting input terminal of the error amplifier 17b, thereby applying negative feedback. The transistor Q2 is driven to make the current flow through the resistor R4 of such an electric current that makes the voltage V4 of the node N4 same as the output control signal Vadj input to the external terminal ADJ in the operation of imaginary short.

The electric current of the transistor Q2 is transferred by the current mirror circuit 17A, and the transferred electric current is made to flow into the connection node N1 of the resistors R11 and R12. Thereby, the voltage of the node N1 is displaced, and the displaced electric potential is input as the feedback voltage VFB1 to the non-inverting input terminal of the error amplifier AMP1 that controls the base terminal of the voltage control transistor Q1. Thereby, the output voltage Vout1 according to the output control signal Vadj is output to the output terminal OUT1 of regulator (first direct-current power supply circuit 11). Accordingly, the current mirror circuit 17A and the output voltage changing circuit 17B form the control voltage generating circuit 17 that changes the output voltage Vout1 to the voltage according to the output control signal Vadj.

In a case where the NTC type is used as the thermistor, the output voltage Vout1 of the regulator (first direct-current power supply circuit 11) including the control voltage generating circuit in FIG. 4 is represented by the following formula:

$$Vout1=((R11+R12)/R12) \times Vref-(V4/R4) \times R11=((R11+R12)/R12) \times Vref-(Vadj/R4) \times R11$$

By inputting, to the above formula, the detected voltage Vt of the temperature detector (Rs, Rt) as the output control signal Vadj, the formula shows that the output voltage Vout1 changes according to the detected voltage Vt of the temperature detector. The variable range of the output voltage Vout1 is Vref to Vin.

The control voltage generating circuit 17 shown in FIG. 5 in a case of using the PTC type as the thermistor includes: a voltage dividing circuit 17a that is formed of resistors R2 and R3 connected in series between the external terminal ADJ and the ground point and divides the output control signal Vadj; and a transistor Q2 and a resistor R4 that are connected in series between the connection node N1 of the resistors R11 and R12 for dividing the output voltage and the ground point.

The control voltage generating circuit 17 includes an error amplifier 17b to which a voltage (voltage of node N3) V3 that is divided by the above voltage dividing circuit 17a is input, and which controls the base terminal of the above transistor Q2.

The negative feedback is applied to this error amplifier 17b by inputting the voltage V4 of the connection node N4 between the resistor R4 and the transistor Q2 of the control target to the non-inverting input terminal. The transistor Q2 is driven to make the current flow through the resistor R4 of such an electric current that makes the voltage V4 of the node N4 same as the voltage V3 of the node N3 in the operation of imaginary short.

By such an electric current flowing through the resistor R4, the voltage V3 of node N3 is displaced, the displaced electric potential is input as the feedback voltage VFB1 to the non-inverting input terminal of the error amplifier AMP1 that controls the base terminal of the voltage control transistor Q1. Thus, the output voltage Vout1 according to the output control signal Vadj is output to the output terminal OUT1 of the regulator (first direct-current power supply circuit 11). Accordingly, the above voltage dividing circuit 17a, the error amplifier 17b, the transistor Q2 and the resistor R4 form the control voltage generating circuit 17 that changes the output voltage Vout 1 to the voltage according to the output control signal Vadj.

The output voltage Vout1 of the regulator (first direct-current power supply circuit 11) in FIG. 5 is represented by the following formula (1):

$$Vout1=((R11+R12)/R12) \times Vref+(V4/R4) \times R11 \quad (1)$$

The voltage V3 of the node N3 is represented by the following formula (2):

$$V3=(R3/(R3+R4)) \times Vadj \quad (2)$$

Due to V4=V3, the above expressions (1) and (2) lead to $$Vout1=((R11+R12)/R12) \times Vref+((R3 \times R11)/R4 \times (R2+R3)) \times Vadj \quad (3)$$

By inputting, to the above formula (3), the detected voltage Vt of the temperature detector (Rs, Rt) as the output control signal Vadj, the formula (3) shows that the output voltage Vout1 changes according to the detected voltage Vt of the temperature detector. The variable range of the output voltage Vout1 is Vref to Vin.

The output voltage Vout1 when the output control signal Vadj is 0V is set by the ratio between the resistors R11 and R12 and the reference voltage Vref since the second term of the above formula (3) is "0". To be specific, in a case where the reference voltage Vref is 1.5V, for example, it is possible to set the output voltage Vout to 3V with Vadj=0V by setting the ratio between R11 and R12 to 1:1. Thus, for example, in a case of designing a power supply device that supplies a power supply voltage to a motor that operates with the lowest voltage 3V or more, it is possible to surely operate the motor and increase the number of rotations of the motor when the detected voltage Vt of the sensor is increased by the temperature rise.

By the regulator IC in the above examples, it is possible to realize an output-voltage variable type direct-current power source that can change the output voltage Vout1 with only the control signal Vadj input to the output control terminal ADJ without using an external part of the IC. Since the output voltage is determined by the accuracy of reference voltage and the ratio between internal resistors, the accuracy and the temperature characteristic are good, and the variable input voltage range is increased and the precision (smallness of variation) with respect to the input voltage is improved. Since the feedback voltage is displaced by voltage-current conversion with the error amplifier and the output voltage is changed, it is possible to realize a variable power supply device that does not have much influence of power supply noise.

In the regulator IC in the above example (FIG. 2), there is provided an on/off control terminal CNT to input an ON/OFF signal for stopping the operation of the IC. However, this on/off control terminal CNT may be omitted. In a case where the on/off control terminal CNT is omitted, the regulator IC can be formed of five terminals, and thus, it is possible to save the space and reduce the cost by making the package compact.

In the power supply device in the above embodiment, each of the first direct-current power source and the second direct-current power source is formed as a linear regulator of a series regulator type. However, a regulator of a shunt regulator type may be used instead of the series regulator type, or the first direct-current power source may be formed by a DC-DC converter of a switching control type. A voltage source using a Zener diode may be used as the reference voltage source 15.

Though the present invention has been specifically described on the basis of the embodiment and examples, the present invention is not limited to the above embodiment or examples. For example, though the control voltage generating circuit 17 is provided to a non-inverting input terminal of the error amplifier AMP1 for voltage control in the embodiment, the control voltage generating circuit 17 may be provided to an inverting input terminal of the error amplifier AMP1 as described in JP 2019-185732 A. The configurations as in the second embodiment and modification example described in JP 2019-185732 A may be adopted.

As for the regulator IC in the above embodiment, a thermistor is used as the temperature detector and the output voltage is linearly changed. A temperature sensor IC may be used instead of the thermistor. There is a type of the temperature sensor IC that switches a flag when the surrounding temperature exceeds a preset temperature. The power supply device may be configured by using such a sensor to change the output voltage in a stepwise manner by inputting a signal corresponding to the flag state to the output control terminal ADJ.

In the regulator IC of the embodiment, the PNP bipolar transistor is used as the voltage control transistor Q1 and the transistor Q2 forming the control voltage generating circuit 17. However, a MOS transistor (insulated gate field effect transistor) may be used instead of the bipolar transistor. In this case, the transistor for voltage control is formed of a P-channel MOS transistor. However, an N-channel MOS transistor may be used. The NPN may be used instead of the PNP for the bipolar transistor.

In the embodiment, an example of applying the present invention to a system in which the sensor detects a temperature and the load is an air blowing device. However, the present invention can also be applied to a system of using a sensor that detects a physical quantity other than the temperature, such as a humidity sensor, a pressure sensor, a photoelectric sensor and an acceleration sensor.

By the power supply device and the semiconductor device for power supply control according to the embodiment, it is possible to control the rotation speed of a fan according to the surrounding temperature without largely increasing the cost. Furthermore, according to the embodiment, it is possible to control the rotation speed of the fan according to the surrounding temperature without influencing the temperature-voltage characteristic of a temperature sensor.

According to an aspect of the present invention, there is provided a power supply device including: a first direct-current power source that generates a direct-current voltage to be supplied to a device that is a load; and a second direct-current power source that generates a direct-current voltage to be supplied to a sensor that detects a physical quantity, wherein the first direct-current power source is an output variable type power source that generates a direct-current voltage that changes according to a signal from the sensor, and the second direct-current power source is an output fixed type power source that generates a constant direct-current voltage.

By the power supply device having the above configuration, the first direct-current power source of the output variable type can change the output voltage by the signal from the sensor, and supply the output voltage to the device that is the load. Thus, it is possible to change the direct-current voltage to be supplied to the device that is the load without using a microcomputer. In addition, a constant direct-current voltage generated by the second direct-current power source can be supplied to the sensor. Thus, it is possible to supply, to the sensor, the direct-current voltage that does not influence the temperature-voltage characteristic of the sensor, and possible to suppress the variation due to the change of surrounding temperature.

Preferably, the load is a blower, and the sensor is a temperature detector, and based on the signal from the sensor, the first direct-current power source makes the direct-current voltage to be supplied to the blower higher as a temperature detected by the sensor is higher.

By the above configuration, it is possible to control the rotation speed of the fan of the air blowing device according to the surrounding temperature, and increase the cooling ability by increasing the rotation speed of the fan as the temperature is higher, and sufficiently cool the target electronic device.

Preferably, each of the first direct-current power source and the second direct-current power source is formed of a linear regulator.

By such a configuration, since each of the first direct-current power source and the second direct-current power source is a linear regulator of a same configuration, it is possible to share a part of the circuit, and thus reduce the number of elements and the occupied area of the circuit.

Preferably, the linear regulator that forms the first direct-current power source includes: a voltage control transistor that is connected between an output terminal and a voltage input terminal to which a direct-current voltage is input; a control circuit that controls the voltage control transistor according to a feedback voltage of an output; and an external terminal to which an output control signal is input, the output control signal being supplied from outside to control an output voltage, wherein the control circuit includes: a first error amplifier that outputs a voltage according to a potential difference between a reference voltage and a divided voltage by a first voltage dividing circuit that divides the output voltage of the output terminal; and an output voltage changing circuit that changes the output voltage to a voltage according to the output control signal by displacing the divided voltage by the first voltage dividing circuit to be input to the first error amplifier according to a voltage that is input to the external terminal.

By the above configuration, it is possible to linearly change the output voltage by the output control signal which is input to the external terminal.

Furthermore, it is not necessary to use an external element, and the output voltage is determined by the accuracy of the reference voltage and the ratio between the internal resistors. Thus, the accuracy and the temperature characteristic are good, and the variable input voltage range is increased and the precision with respect to the input voltage is improved.

Preferably, the output voltage changing circuit includes: a second voltage dividing circuit that divides the voltage input to the external terminal; a first transistor and a resisting element that are connected in series between a constant potential point and a node at which the divided voltage by the first voltage dividing circuit is taken out; and a second error amplifier that outputs a voltage according to a potential difference between a divided voltage by the second voltage dividing circuit and a voltage obtained by current-to-voltage conversion by the resisting element, wherein an output of the second error amplifier is applied to a control terminal of the first transistor.

By such a configuration, the feedback voltage is displaced by voltage-to-current conversion by the error amplifier to change the output voltage. Thus, it is possible to realize an output variable direct-current power source that does not have much influence of the power supply noise.

According to another aspect of the present invention, there is provided a semiconductor device for power supply control including: a voltage input terminal to which a direct-current voltage is input; a first output terminal and a second output terminal; a first voltage control transistor that is connected between the voltage input terminal and the first output terminal; a first control circuit that controls the first voltage control transistor according to a feedback voltage of an output of the first output terminal; a second voltage control transistor that is connected between the voltage input terminal and the second output terminal; a second control circuit that controls the second voltage control transistor according to a feedback voltage of an output of the second output terminal; and an external terminal to which an output control signal is input, the output control signal being supplied from outside to control an output voltage of the first output terminal, wherein the first control circuit includes: a first error amplifier that outputs a voltage according to a potential difference between a reference voltage and a divided voltage by a first voltage dividing circuit that divides the output voltage of the first output terminal; and an output voltage changing circuit that changes the output voltage of the first output terminal to a voltage according to the output control signal by displacing the divided voltage by the first voltage dividing circuit or the reference voltage to be input to the first error amplifier according to a voltage that is input to the external terminal, and the second control circuit includes a second error amplifier that outputs a voltage according to a potential difference between a predetermined reference voltage and a divided voltage by a second voltage dividing circuit that divides an output voltage of the second output terminal.

By the semiconductor device for power supply control having the above configuration, the first control circuit can linearly change the output voltage of the first output terminal by input of the control signal to the external terminal, and the second control circuit can maintain the output voltage of the second output terminal to be constant, and thus it is possible to avoid the change of characteristic of the sensor caused by the temperature by supplying the output voltage of the second output terminal to the sensor.

Preferably, a voltage that is input to the external terminal is a detected voltage from a temperature detector, and the first control circuit controls the first voltage control transistor to make the output voltage of the first output terminal higher as a temperature detected by the temperature detector is higher.

By such a configuration, it is possible to control the rotation speed of the fan of the air blowing device according to the internal temperature of the electronic device by providing the temperature detector inside the electronic device and supplying the output voltage of the first output terminal to the air blowing device. It is possible to enhance the cooling ability by increasing the rotation speed of the fan as the temperature is higher, and cool the electronic device that is a target.

Although some embodiments of the present invention have been described and illustrated in detail, the disclosed embodiments are made for purposes of not limitation but illustration and example only. The scope of the present invention should be interpreted by terms of the appended claims.

What is claimed is:

1. A semiconductor device for power supply control comprising:
   a voltage input terminal to which a direct-current voltage is input;
   a first output terminal and a second output terminal;
   a first voltage control transistor that is connected between the voltage input terminal and the first output terminal;
   a first control circuit that controls the first voltage control transistor according to a feedback voltage of an output of the first output terminal;
   a second voltage control transistor that is connected between the voltage input terminal and the second output terminal;
   a second control circuit that controls the second voltage control transistor according to a feedback voltage of an output of the second output terminal; and
   an external terminal to which an output control signal is input, the output control signal being supplied from outside to control an output voltage of the first output terminal,
   wherein:
   the first control circuit includes:
      a first error amplifier that outputs a voltage according to a potential difference between a first reference voltage and a divided voltage by a first voltage dividing circuit that divides the output voltage of the first output terminal; and
      an output voltage changing circuit that changes the output voltage of the first output terminal to a voltage according to the output control signal by displacing the divided voltage by the first voltage dividing circuit or the first reference voltage to be input to the first error amplifier according to a voltage that is input to the external terminal, and
   the second control circuit includes a second error amplifier that outputs a voltage according to a potential difference between a second reference voltage and a divided voltage by a second voltage dividing circuit that divides an output voltage of the second output terminal.

2. The semiconductor device for power supply control according to claim 1, wherein:
   a voltage that is input to the external terminal is a detected voltage from a temperature detector, and
   the first control circuit controls the first voltage control transistor to make the output voltage of the first output terminal higher as a temperature detected by the temperature detector is higher.

3. A power supply device comprising:
   a first direct-current power source that generates a direct-current voltage to be supplied to a device that is a load; and
   a second direct-current power source that generates a direct-current voltage to be supplied to a sensor that detects a physical quantity,
   wherein:
   the first direct-current power source comprises an output variable type power source that generates a direct-current voltage that changes according to a signal from the sensor,
   the first direct-current power source includes:
      a voltage control transistor that is connected between an output terminal and a voltage input terminal to which a direct-current voltage is input;
      a control circuit that controls the voltage control transistor according to a feedback voltage of an output; and
      an external terminal to which an output control signal is input, the output control signal being supplied from outside to control an output voltage,
   the second direct-current power source comprises an output fixed type power source that generates a constant direct-current voltage, and
   the control circuit includes:
      a first error amplifier that outputs a voltage according to a potential difference between a reference voltage and a divided voltage by a first voltage dividing circuit that divides the output voltage of the output terminal; and
      an output voltage changing circuit that changes the output voltage to a voltage according to the output control signal by displacing the divided voltage by the first voltage dividing circuit or the reference voltage to be input to the first error amplifier according to a voltage that is input to the external terminal.

4. The power supply device according to claim 3, wherein:
   the output voltage changing circuit includes:
      a second voltage dividing circuit that divides the voltage input to the external terminal;
      a first transistor and a resisting element that are connected in series between a constant potential point and a node at which the divided voltage by the first voltage dividing circuit is taken out; and
      a second error amplifier that outputs a voltage according to a potential difference between a divided voltage by the second voltage dividing circuit and a voltage obtained by current-to-voltage conversion by the resisting element, and
   an output of the second error amplifier is applied to a control terminal of the first transistor.

5. The power supply device according to claim 3, wherein the second direct-current power source comprises a linear regulator.

6. A power supply device comprising:
   a first direct-current power source that generates a direct-current voltage to be supplied to a device that is a load; and
   a second direct-current power source that generates a direct-current voltage to be supplied to a sensor that detects a temperature, wherein:
the first direct-current power source comprises an output variable type power source that generates a direct-current voltage that changes according to a signal from the sensor,
the second direct-current power source comprises an output fixed type power source that generates a constant direct-current voltage, and
based on the signal from the sensor, the first direct-current power source makes the direct-current voltage to be supplied to the load higher as the temperature detected by the sensor is higher.

7. The power supply device according to claim 6, wherein the load is a blower.

8. The power supply device according to claim 6, wherein each of the first direct-current power source and the second direct-current power source comprises a linear regulator.

\* \* \* \* \*